(12) United States Patent
Shah et al.

(10) Patent No.: US 8,062,930 B1
(45) Date of Patent: *Nov. 22, 2011

(54) SUB-MODULE CONFORMAL ELECTROMAGNETIC INTERFERENCE SHIELD

(75) Inventors: Milind Shah, Greensboro, NC (US); Donald Joseph Leahy, Kernersville, NC (US); T. Scott Morris, Clemmons, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/435,913

(22) Filed: May 17, 2006

Related U.S. Application Data

(63) Continuation-in-part of application No. 11/199,319, filed on Aug. 8, 2005, now Pat. No. 7,451,539.

(51) Int. Cl.
*H01L 21/00* (2006.01)
(52) U.S. Cl. .................. 438/110; 438/113; 438/127
(58) Field of Classification Search .................. 438/110, 438/113, 127
See application file for complete search history.

(56) References Cited

U.S. PATENT DOCUMENTS

| | | |
|---|---|---|
| 3,566,190 A | 2/1971 | Brown |
| 3,907,616 A | 9/1975 | Wiemer |
| 4,680,676 A | 7/1987 | Petratos et al. |
| 5,389,738 A | 2/1995 | Piosenka et al. |
| 5,406,630 A | 4/1995 | Piosenka et al. |
| 5,459,368 A | 10/1995 | Onishi et al. |
| 5,473,512 A | 12/1995 | Degani et al. |
| 5,639,989 A | 6/1997 | Higgins |
| 5,646,828 A | 7/1997 | Degani et al. |
| 5,650,659 A | 7/1997 | Mostafazadeh et al. |
| 5,977,626 A | 11/1999 | Wang et al. |
| 6,004,180 A | 12/1999 | Knall et al. |
| 6,011,698 A | 1/2000 | Buehler |
| 6,137,693 A | 10/2000 | Schwiebert et al. |
| 6,150,193 A | 11/2000 | Glenn |
| 6,163,454 A | 12/2000 | Strickler |
| 6,297,957 B1 | 10/2001 | Johnson et al. |
| 6,448,583 B1 | 9/2002 | Yoneda et al. |
| 6,448,793 B1 | 9/2002 | Barratt et al. |
| 6,466,416 B1 * | 10/2002 | Honjo et al. .................. 360/317 |

(Continued)

FOREIGN PATENT DOCUMENTS

| | | |
|---|---|---|
| CN | 1855451 | 11/2006 |

(Continued)

OTHER PUBLICATIONS

International Search Report for PCT/US2008/068153, mailed Dec. 9, 2008.

(Continued)

*Primary Examiner* — Fernando L Toledo
(74) *Attorney, Agent, or Firm* — Withrow & Terranova, P.L.L.C.

(57) ABSTRACT

The present invention relates to a manufacturing process of a sub-module having an electromagnetic shield. Initially, a meta-module having circuitry for two or more sub-modules is formed. An overmold body is placed over the circuitry for all of the sub-modules. The overmold body of the meta-module is sub-diced to expose a metallic layer grid around each of the sub-modules. Next, an electromagnetic shield is applied to the exterior surface of the overmold body of each of the sub-modules and in contact with the metallic layer grid. The meta-module is then singulated to form modules having two or more sub-modules.

33 Claims, 8 Drawing Sheets

U.S. PATENT DOCUMENTS

| | | | |
|---|---|---|---|
| 6,538,196 B1 | 3/2003 | MacDonald et al. | |
| 6,590,152 B1 | 7/2003 | Horio et al. | |
| 6,599,779 B2 | 7/2003 | Shim et al. | |
| 6,613,660 B2 | 9/2003 | Kahlert et al. | |
| 6,633,073 B2 | 10/2003 | Rezvani et al. | |
| 6,657,592 B2 | 12/2003 | Dening et al. | |
| 6,707,168 B1 | 3/2004 | Hoffman et al. | |
| 6,717,485 B2 | 4/2004 | Kolb | |
| 6,791,795 B2 | 9/2004 | Ohtomo et al. | |
| 6,807,731 B2 | 10/2004 | Brandenburg et al. | |
| 6,825,560 B1 | 11/2004 | Walker et al. | |
| 6,838,750 B2 | 1/2005 | Nuytkens et al. | |
| 6,887,787 B2 | 5/2005 | Farnworth | |
| 6,946,324 B1 | 9/2005 | McLellan et al. | |
| 6,998,532 B2 | 2/2006 | Kawamoto et al. | |
| 7,030,469 B2 | 4/2006 | Mahadevan et al. | |
| 7,042,398 B2 | 5/2006 | Tang | |
| 7,087,461 B2 | 8/2006 | Park et al. | |
| 7,087,462 B1 | 8/2006 | Park et al. | |
| 7,109,817 B2 | 9/2006 | Kolb et al. | |
| 7,125,744 B2 * | 10/2006 | Takehara et al. | 438/106 |
| 7,187,060 B2 | 3/2007 | Usui | |
| 7,227,719 B2 * | 6/2007 | Sasaki et al. | 360/125.39 |
| 7,259,041 B2 | 8/2007 | Stelzl et al. | |
| 7,342,303 B1 | 3/2008 | Berry et al. | |
| 7,348,663 B1 | 3/2008 | Kirloskar et al. | |
| 7,433,203 B1 | 10/2008 | Yi et al. | |
| 7,443,693 B2 | 10/2008 | Arnold et al. | |
| 7,445,968 B2 | 11/2008 | Harrison et al. | |
| 7,451,539 B2 * | 11/2008 | Morris et al. | 29/832 |
| 7,478,474 B2 | 1/2009 | Koga | |
| 7,488,903 B2 | 2/2009 | Kawagishi et al. | |
| 7,514,772 B2 | 4/2009 | Kobayashi et al. | |
| 7,598,606 B2 | 10/2009 | Chow et al. | |
| 7,633,170 B2 | 12/2009 | Yang et al. | |
| 7,635,918 B2 | 12/2009 | Yoshida | |
| 7,643,311 B2 | 1/2010 | Coffy | |
| 7,665,201 B2 | 2/2010 | Sjoedin | |
| 7,671,451 B2 | 3/2010 | Lee et al. | |
| 7,700,411 B2 | 4/2010 | Yang et al. | |
| 7,928,538 B2 | 4/2011 | Salzman | |
| 2002/0036345 A1 | 3/2002 | Iseki et al. | |
| 2002/0118529 A1 | 8/2002 | Babin et al. | |
| 2003/0011049 A1 | 1/2003 | Nuytkens et al. | |
| 2003/0048581 A1 * | 3/2003 | Ohtomo et al. | 360/126 |
| 2003/0062541 A1 | 4/2003 | Warner | |
| 2004/0103509 A1 | 6/2004 | Bidard et al. | |
| 2004/0104473 A1 | 6/2004 | Farnworth | |
| 2004/0178500 A1 | 9/2004 | Usui | |
| 2004/0209434 A1 | 10/2004 | Seaford et al. | |
| 2004/0214023 A1 * | 10/2004 | Park et al. | 428/458 |
| 2004/0232536 A1 | 11/2004 | Fukuzumi | |
| 2004/0238934 A1 | 12/2004 | Warner et al. | |
| 2005/0046001 A1 | 3/2005 | Warner | |
| 2005/0153061 A1 | 7/2005 | Nuytkens et al. | |
| 2006/0033184 A1 | 2/2006 | Park et al. | |
| 2006/0151203 A1 | 7/2006 | Krueger et al. | |
| 2006/0244131 A1 | 11/2006 | Kobayashi et al. | |
| 2006/0274517 A1 | 12/2006 | Coffy | |
| 2007/0030661 A1 * | 2/2007 | Morris et al. | 361/818 |
| 2007/0045248 A1 | 3/2007 | Schein et al. | |
| 2007/0062637 A1 | 3/2007 | Sjoedin | |
| 2007/0163802 A1 | 7/2007 | Monthei | |
| 2007/0200210 A1 | 8/2007 | Zhao et al. | |
| 2007/0290322 A1 | 12/2007 | Zhao et al. | |
| 2008/0019112 A1 | 1/2008 | Hatanaka et al. | |
| 2008/0054421 A1 | 3/2008 | Dimaano et al. | |
| 2008/0142938 A1 | 6/2008 | Chow et al. | |
| 2008/0157316 A1 | 7/2008 | Yang | |
| 2008/0210462 A1 | 9/2008 | Kawagishi et al. | |
| 2008/0224306 A1 | 9/2008 | Yang | |
| 2008/0308912 A1 | 12/2008 | Cha et al. | |
| 2009/0072364 A1 | 3/2009 | Punzalan et al. | |
| 2009/0140402 A1 | 6/2009 | Ohtani | |

FOREIGN PATENT DOCUMENTS

| | | | |
|---|---|---|---|
| EP | 1715520 A1 | 10/2006 | |
| EP | 1717857 A2 | 11/2006 | |
| EP | 1764834 B1 | 3/2007 | |
| JP | 11-163583 | 6/1999 | |
| JP | 2004-207352 | 7/2004 | |
| JP | 2005-039007 | 2/2005 | |
| JP | 2005109306 A | 4/2005 | |
| JP | 2006-332255 | 12/2006 | |
| JP | 2007-311396 | 11/2007 | |
| KR | 2006113412 | 2/2006 | |
| WO | 0035085 A1 | 6/2000 | |
| WO | 03058812 A1 | 7/2003 | |
| WO | 2004019490 A1 | 3/2004 | |
| WO | 2004060034 A1 | 7/2004 | |
| WO | 2007060784 | 5/2007 | |

OTHER PUBLICATIONS

English translation of JP 2005-109306 A to Takase et al., publication date Apr. 25, 2005. Translation available Sep. 20, 2010. Abstract previously submitted Jan. 19, 2009.

RF Micro Devices, Inc., "Fractional-N RF Synthesizer with Modulator and Digital IF Filter," RF6001, Rev A2, May 6, 2002, 2 pages.

CHOMERICS, "Cho-Shield Conductive Coatings," 3 pages, 2001.

Non-final Office Action, mailed Dec. 15, 2010, from U.S. Appl. No. 11/952,592.

Final Office Action, mailed Dec. 23, 2010, from U.S. Appl. No. 11/952,634.

Final Office Action mailed Feb. 24, 2011 regarding U.S. Appl. No. 11/952,592.

Notice of Allowance mailed Mar. 3, 2011 regarding U.S. Appl. No. 11/952,634.

Nonfinal Office Action mailed May 10, 2011 regarding U.S. Appl. No. 11/952,513 filed Dec. 7, 2007.

Nonfinal Office Action mailed Jul. 28, 2011 regarding U.S. Appl. No. 11/952,617.

Nonfinal Office Action & Restriction Requirement mailed Jun. 13, 2011 for U.S. Appl. No. 11/952,634.

Nonfinal Office Action mailed Jun. 22, 2011 for U.S. Appl. No. 11/952,670.

* cited by examiner

SUB-MODULE CONFORMAL ELECTROMAGNETIC INTERFERENCE SHIELD

RELATED APPLICATIONS

The present application is related to U.S. Pat. No. 7,451, 539 issued Nov. 18, 2008; U.S. application Ser. No. 11/768, 014 filed Jun. 25, 2007; U.S. application Ser. No. 11/952,484 filed Dec. 7, 2007; U.S. application Ser. No. 11/952,513 filed Dec. 7, 2007; U.S. application Ser. No. 11/952,545 filed Dec. 7, 2007; U.S. application Ser. No. 11/952,592 filed Dec. 7, 2007; U.S. application Ser. No. 11/952,617 filed Dec. 7, 2007; U.S. application Ser. No. 11/952,634 filed Dec. 7, 2007; U.S. application Ser. No. 11/952,670 filed Dec. 7, 2007; and U.S. application Ser. No. 11/952,690 filed Dec. 7, 2007, the disclosures of which are incorporated herein by reference in their entireties.

This application is a continuation-in-part of U.S. application Ser. No. 11/199,319 filed Aug. 8, 2005, entitled CONFORMAL ELECTROMAGNETIC INTERFERENCE SHIELD, the disclosure of which is hereby incorporated by reference in its entirety.

FIELD OF THE INVENTION

The present invention relates to providing shielding for a sub-module, wherein the shield is designed to reduce electromagnetic interference experienced by the electronic sub-module.

BACKGROUND OF THE INVENTION

Electronic components have become ubiquitous in modern society. The electronics industry proudly, but routinely, announces accelerated clocking speeds and smaller integrated circuit modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed transitions inherently mean higher frequencies. Higher frequencies mean shorter wavelengths, requiring shorter conductive elements to act as antennas to broadcast these electromagnetic emissions. The electromagnetic emissions radiate from a source and may impinge upon other electronic components. If the signal strength of the emission at the impinged upon electronic component is high enough, the emission may interfere with the operation of the impinged upon electronic component. This phenomenon is sometimes called electromagnetic interference (EMI) or crosstalk. Dealing with EMI and crosstalk is sometimes referred to as electromagnetic compatibility (EMC). Other components, such as transceiver modules, inherently have many radiating elements that raise EMI concerns. Thus, even modules that do not have high clock speeds may need to address EMI issues. Furthermore, sub-modules making up a module may need to be shielded from EMI transmissions.

One way to reduce EMI to comply with FCC regulations is to shield the sub-modules. Typically the shield is formed from a grounded conductive material that surrounds the sub-module. When electromagnetic emissions from the sub-module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the sub-module does not experience EMI from other sub-modules.

However, as the sub-modules continue to become smaller from miniaturization, creating effective shields that do not materially add to the size of the sub-module becomes more difficult. Thus, there is a need for an electromagnetic shield that is inexpensive to manufacture on a large scale, does not substantially change the size of the sub-module, and effectively deals with EMI concerns.

SUMMARY OF THE INVENTION

The present invention relates to a manufacturing process for a sub-module having an electromagnetic shield. Initially, a meta-module having circuitry for two or more sub-modules is formed. An overmold body is placed over the circuitry for all of the sub-modules. The overmold body of the meta-module is sub-diced to expose a metallic layer grid around each of the sub-modules. Next, an electromagnetic shield is applied to the exterior surface of the overmold body of each of the sub-modules and in contact with the metallic layer grid. The meta-module is then singulated to form modules having two or more sub-modules.

There are two primary embodiments pertaining to the make-up of the electromagnetic shield of the present invention. In the first embodiment, an electroless plating process forms a seed layer of conductive material, such as copper (Cu), over the overmold body and in contact with the metallic layer grid for each sub-module. The seed layer then carries current for an electrolytic plating process, which deposits a second conductive layer on the seed layer. A third layer may be applied through a second electrolytic plating process. The third layer is a relatively poor conductor compared to the seed layer and the second conductive layer, and may be formed with a material such as nickel (Ni). The seed layer and second layer form a conductive layer that provides an effective electromagnetic shield for the sub-module. The third layer may contribute to the conduction that helps shield the sub-module, and may also provide some absorption of electromagnetic signals to further shield the sub-module.

The second embodiment includes a conductive epoxy paint sprayed over the overmold body of each sub-module. In particular, the epoxy may include metallic flecks, such as copper (Cu) and/or silver (Ag) flecks, therein. When the epoxy is sprayed over the overmold body of the sub-module and in contact with the metallic layer, the metallic flecks form a conductive layer that shields the sub-module. Both embodiments are designed to be implemented prior to singulation of the meta-module. Thus, after the shield is applied, the meta-module may be singulated to form modules, each having two or more sub-modules. These modules may be further processed as needed or desired.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is directed to providing improved manufacturing techniques to shield a sub-module. The present invention may be used with any number of different sub-modules created on the surface of a laminate, which may include but are not limited to transceiver circuitry, power amplifier circuitry, and the like. The manufacturing techniques of the present invention incorporate a metallic layer grid, which provides a metal trace around the periphery of each sub-module. After sub-dicing through the overmold body is performed to expose the metallic layer grid around the periphery of the sub-modules, the exposed surface of the overmold body of each sub-module is roughened. In one embodiment, an electroless plating process deposits a conductive seed layer on the overmold body of the sub-module and in contact with the metallic layer grid. Then, an electrolytic plating process is used to deposit a second conductive layer onto the seed layer. A final layer of a metallic material, such as nickel, is then deposited on top of the second conductive layer through another electrolytic plating process. In a second embodiment, after sub-dicing and roughening, a conductive epoxy or paint is applied to the overmold body of the sub-module and in contact with the metallic layer grid. In both embodiments, the conductive layers create an electromagnetic shield around the sub-module so as to reduce electromagnetic interference (EMI).

Figure 1:
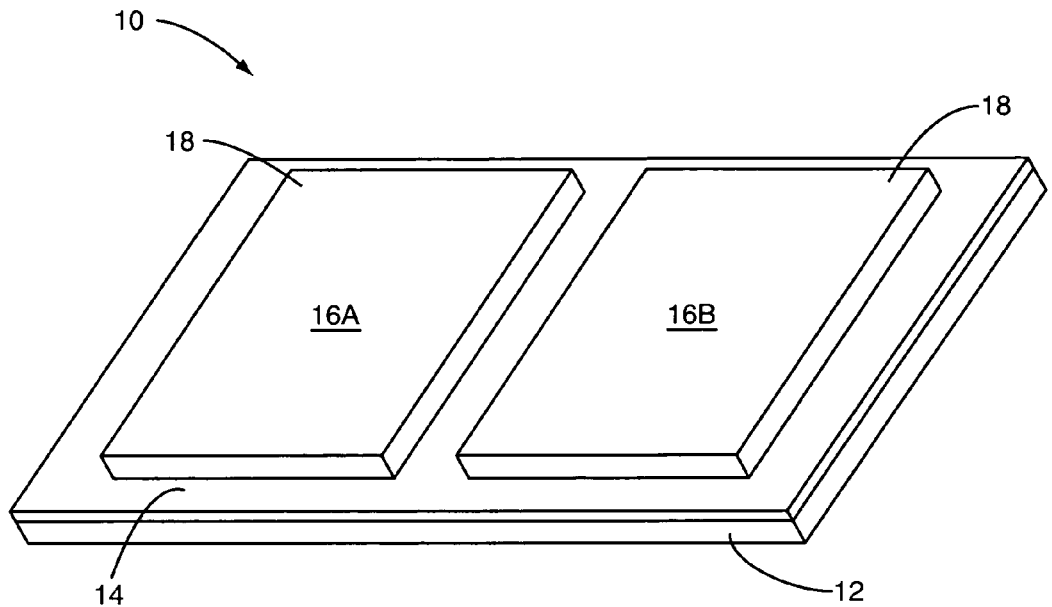
FIG. 1 illustrates a module having two sub-modules, each covered by an overmold body according to an example of the present invention.

A module 10 is illustrated in FIG. 1. The module 10 has a laminate 12, which has a metallic layer grid 14 mounted directly on top of the laminate 12. Two component areas 16A and 16B are positioned in the metallic layer grid 14. The component areas 16A and 16B will provide areas for the passive and active components (not shown) to be positioned onto the laminate 12. The component areas 16A and 16B having the passive and active components are covered by an overmold body 18. An EMI shield is formed over the overmold body 18 and in contact with the metallic layer grid 14, as will be described further below.

Figure 2:
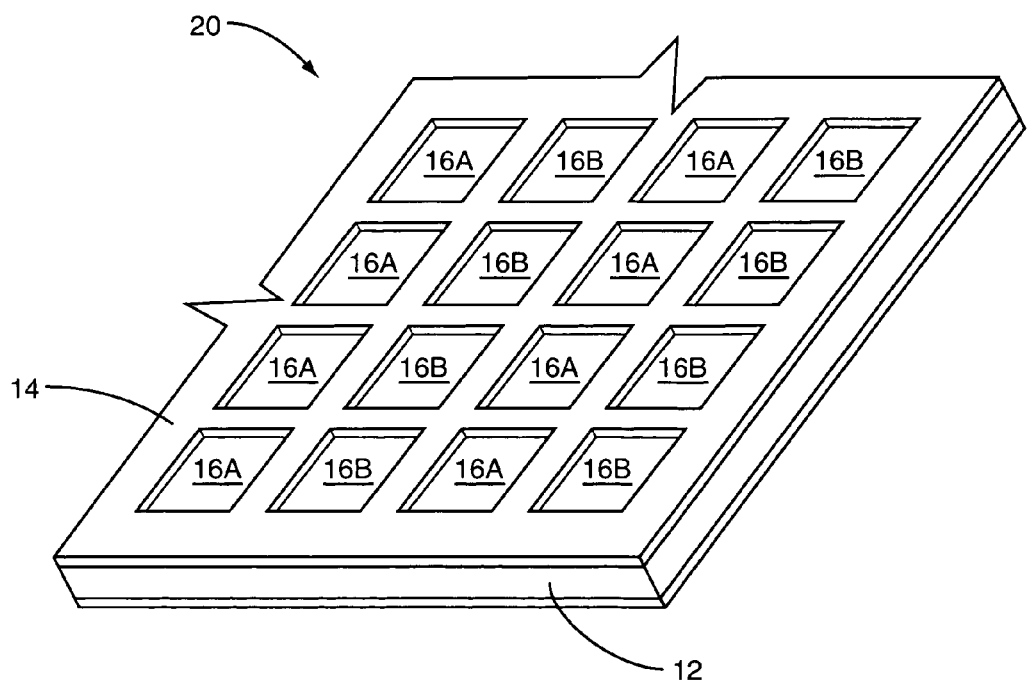
FIG. 2 illustrates a laminate structure having several electronic sub-module component areas.

A laminate structure 20 is illustrated in FIG. 2, wherein a metallic layer grid 14 is formed on the top surface of the laminate 12. The metallic layer grid 14 formed on the laminate structure 20 is essentially a crosshatch of metal traces, which have a defined width. Each opening of the metallic layer grid 14 forms a component area 16A or 16B in which the active components of a sub-module are formed. As a result, a continuous metal trace is formed about the periphery of each component area 16A and 16B. As used herein, the term "periphery" is defined to be the outermost part or region within a precise boundary, in particular, the boundary formed by the peripheral edge of a component area 16A or 16B.

Figure 3:
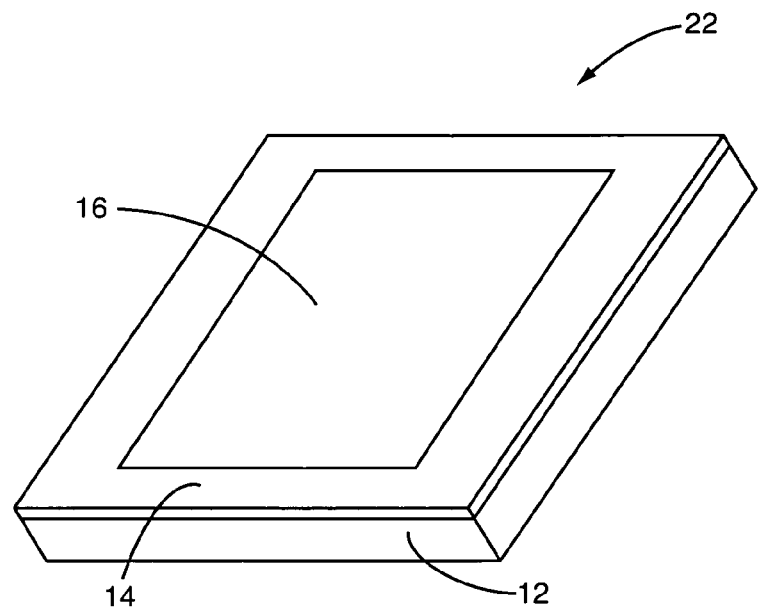
FIG. 3 illustrates a sub-module having a component area positioned on a laminate within an exposed metallic layer grid.
Figure 4:
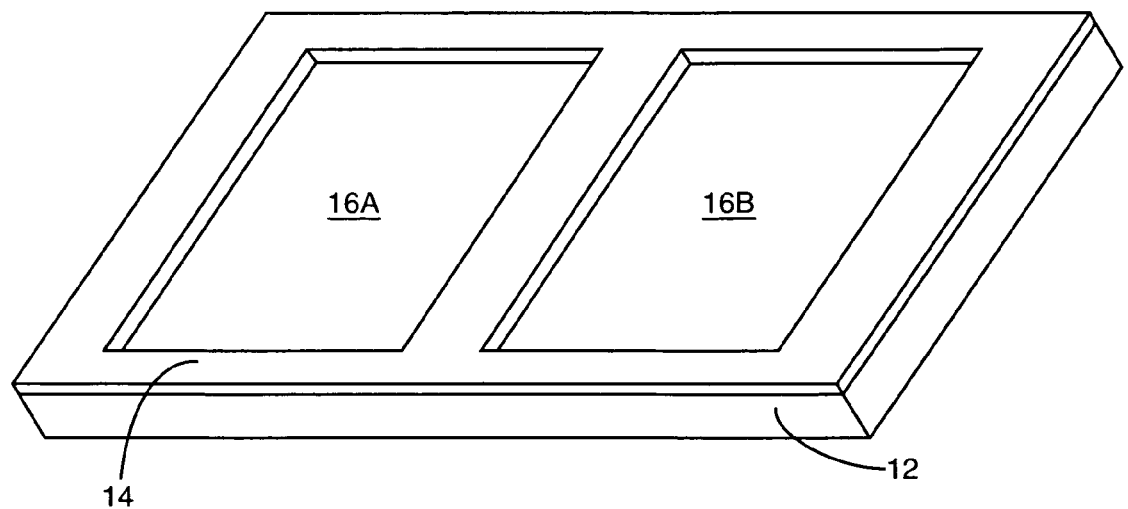
FIG. 4 illustrates a module having two sub-modules prior to EMI shielding and covering each sub-module with an overmold body.

FIG. 3 depicts a section of the laminate structure 20 corresponding to a sub-module 22. FIG. 4 depicts a section of the laminate structure 20 having two component areas 16A and 16B, corresponding to a module 10 having two sub-modules (not shown).

Figure 5:
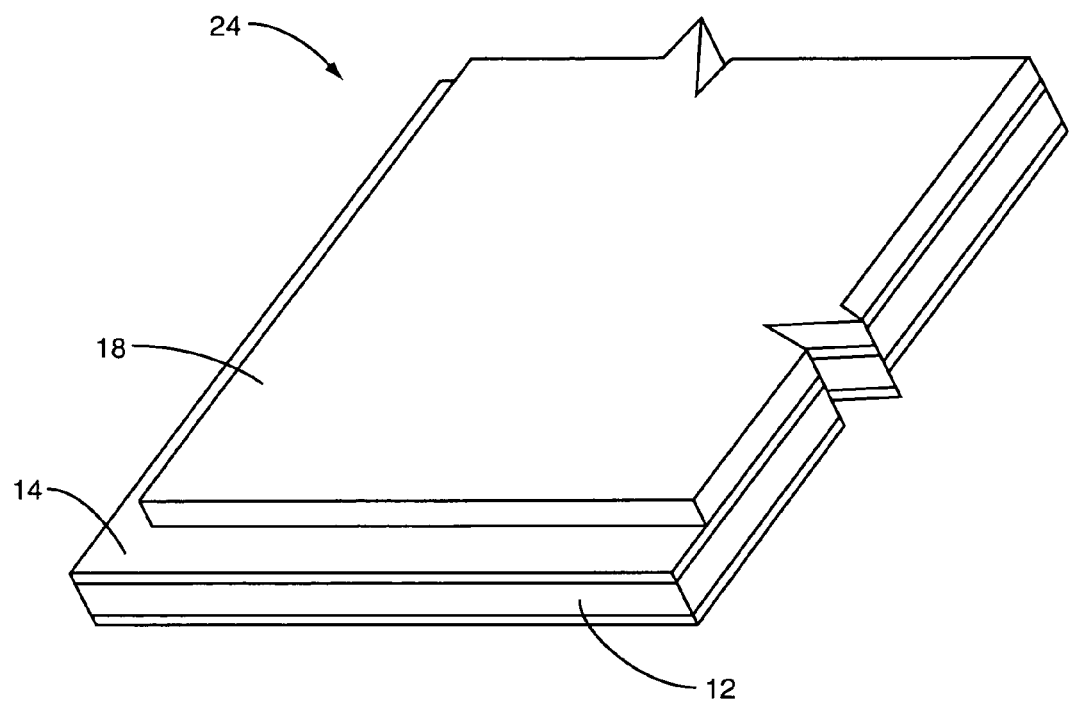
FIG. 5 illustrates a meta-module covered by an overmold body prior to sub-dicing.

In FIG. 5, a section of a meta-module 24 is shown. The meta-module 24 is formed by providing the active components within the component areas 16A and 16B of FIG. 2, and covering substantially all of the laminate structure 20 with an overmold body 18. It should be appreciated that during the manufacturing of the meta-module 24, the metallic layer grid 14 is encased within the overmold body 18 of the meta-module 24. The overmold body 18 may be a plastic dielectric material or the like, as is conventional.

Figure 6:
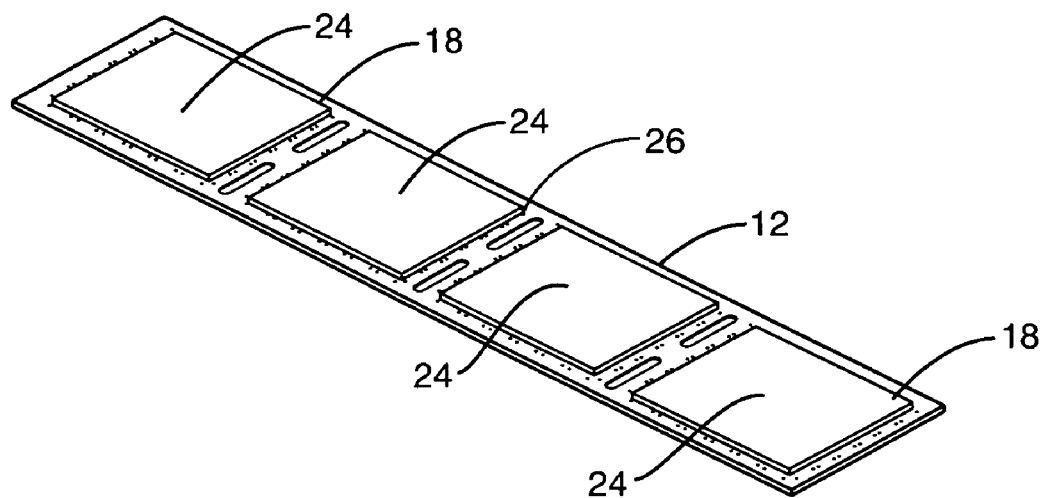
FIG. 6 illustrates a strip of meta-modules prior to implementation of the present invention.

FIG. 6 illustrates four meta-modules 24 on a strip of laminate 12. The meta-modules 24 are formed having numerous sub-modules 22 within an overmold body 18. The strip of laminate 12 may include apertures 26 (sometimes called fiducials), which may assist in aligning the strip of laminate 12 for the following steps.

Figure 7:
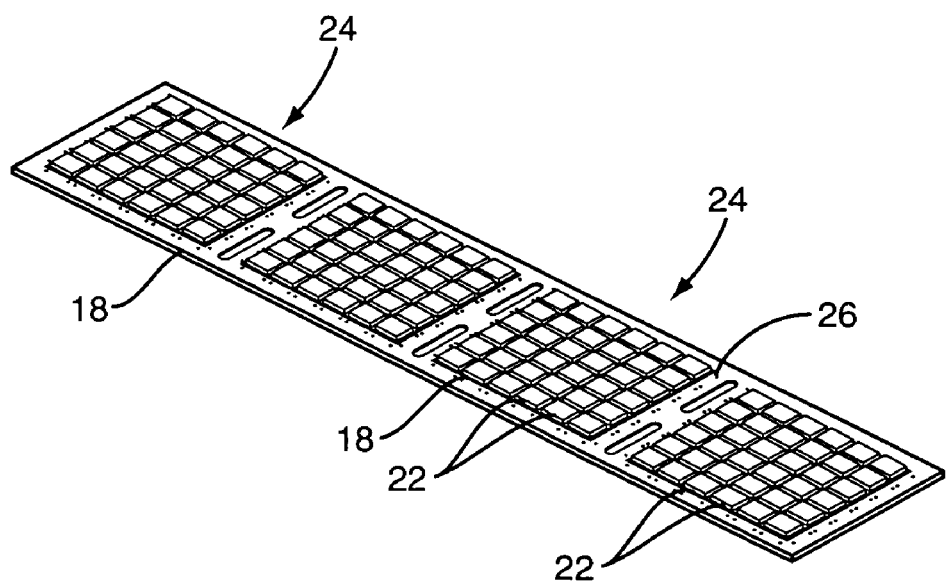
FIG. 7 illustrates the strip of meta-modules of FIG. 6 after a sub-dicing operation.

FIG. 7 illustrates the meta-modules 24 after a sub-dicing step. Sub-dicing cuts through the overmold body 18 to, but not through, the metallic layer grid 14 around each component area 16A and 16B of each sub-module 22. As such, the metallic layer grid 14 is exposed after the sub-dicing step. In particular, each meta-module 24 has been sub-diced such that the overmold body 18 of each sub-module 22 is distinct from one another.

Figure 8:
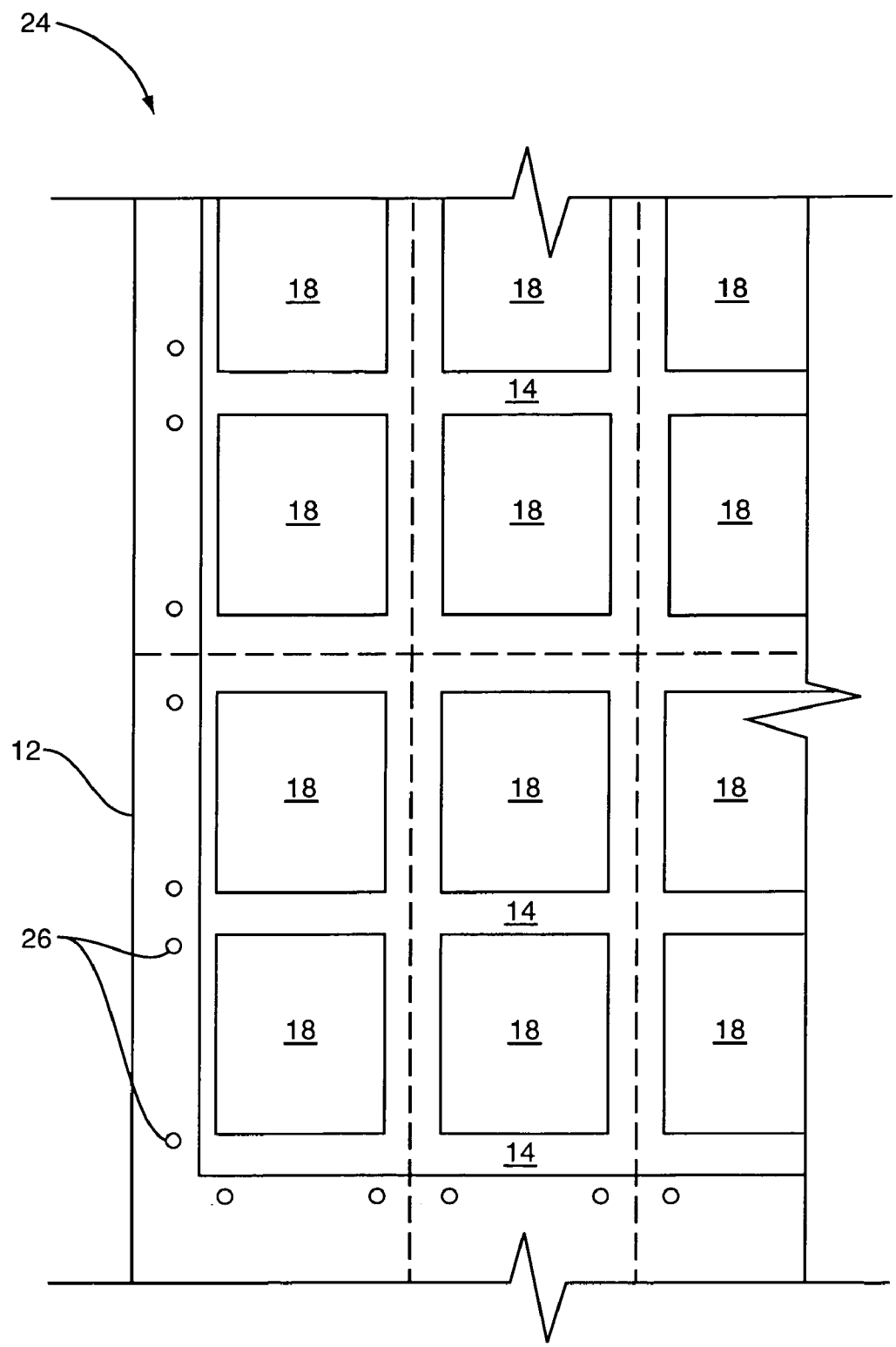
FIG. 8 illustrates a top plan view of part of the meta-module of FIG. 6 with the singulation cuts illustrated.

FIG. 8 illustrates a top plan view of part of a meta-module 24 after sub-dicing, but before singulation. As is readily apparent, the metallic layer grid 14 is exposed around the periphery of each sub-module 22. The dashed lines represent cuts to be made in a subsequent singulation process. The singulation process separates the modules 10 from one another. Although each module 10 is shown having two sub-modules 22, those skilled in the art will recognize that a module 10 may include any number of sub-modules 22.

Figure 9:
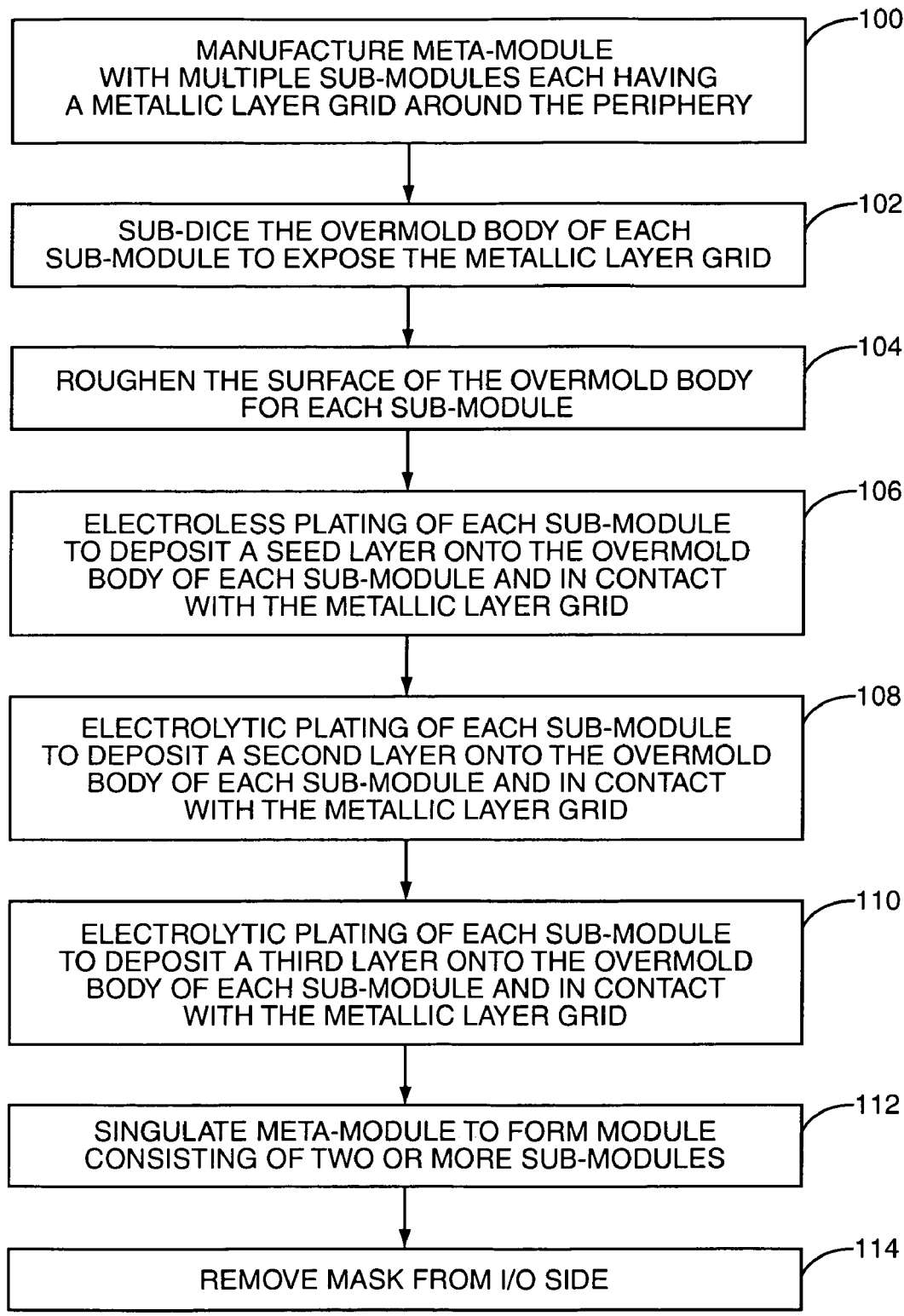
FIG. 9 illustrates a flow diagram of the corresponding steps associated with the manufacturing process according to a first embodiment of the present invention.
Figure 10:
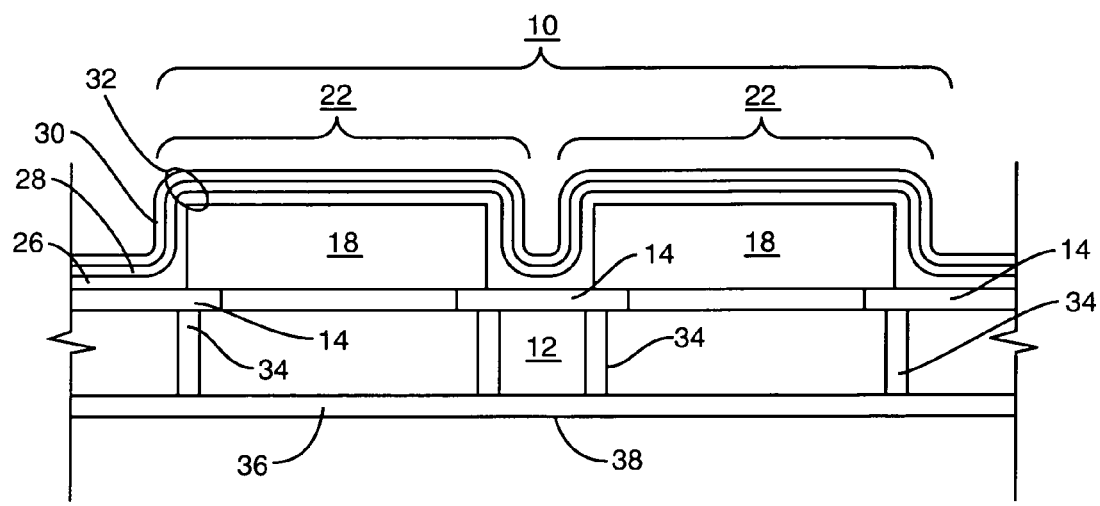
FIG. 10 illustrates an exemplary module constructed according to the embodiment of FIG. 9.

FIG. 9 illustrates a process flow diagram detailing the steps for creating the module 10 illustrated in FIG. 10. In particular, a meta-module 24 is formed, wherein each sub-module 22 within the meta-module 24 has a metal trace about the periphery of the component area 16A or 16B (step 100). The metal trace is formed from the metallic layer grid 14. Next, a sub-dicing process is employed to cut through the overmold body 18 of each sub-module 22 and to the metallic layer grid 14 (step 102). At this point, a portion of the metallic layer grid 14 is exposed about the periphery of the overmold body 18 for each sub-module 22. After sub-dicing, the exposed surface of the overmold body 18 for each sub-module 22 is roughened through an abrasion process, a desmear technique, or other process (step 104). It should be appreciated that a mask (not shown) is positioned on the underside of the laminate 12 so that the process described in the steps below does not interfere with the electrical contacts of each sub-module 22.

After roughening, an electroless plating process is performed to deposit a seed layer 26 of a conductive material on top of the overmold body 18 of the sub-module 22 and in contact with the metallic layer grid 14 (step 106). In an exemplary embodiment, the seed layer 26 of conductive material may be Copper (Cu), Aluminum (Al), Silver (Ag), Gold (Au), or other material as needed or desired. An electroless plating process is defined herein to be a chemical deposition of metal instead of electrical-based deposition.

An exemplary electroless plating process of Cu on a dielectric substrate requires the prior deposition of a catalyst such as a palladium-tin (Pd—Sn) colloid consisting of a metallic Pd core surrounded by a stabilizing layer of Sn ions. The activation step (deposition of the colloid) is usually followed by an acceleration step (removal of excess ionic tin). Adhesion of the deposit to the substrate is improved by mechanical and chemical pretreatment steps. Other electroless plating processes could also be used and are considered within the scope of the present invention.

After the seed layer 26 of conductive material is created over the overmold body 18 of the sub-module 22 and in contact with the metallic layer grid 14, an electrolytic plating process is performed to deposit a second layer 28 of conductive material on top of the initially deposited seed layer 26 (Step 108). In an exemplary embodiment, the second layer 28 of conductive material may be Cu, Al, Ag, Au, or other material as needed or desired. It should be appreciated that the metallic layer grid 14 is electrically coupled to the seed layer 26, and the seed layer 26 then carries the current for the electrolytic plating process.

After the second layer 28 is generated, a third layer 30 is created on top of the second layer 28 through a second electrolytic plating process (step 110). The third layer 30 may be comparatively a poor conductor, and may be a layer of low stress nickel (Ni) or the like. Nickel serves to protect the conductive layers so that they do not tarnish, corrode, or otherwise suffer from environmental effects. Likewise, nickel may contribute to the shielding function by absorbing electromagnetic radiation.

In an exemplary embodiment, the seed layer 26, the second layer 28, and the third layer 30 form a shield 32, which is approximately 20 µm thick. Greater or lesser thicknesses may also be generated. At least one metallic coated or filled via 34 may electrically couple the metallic layer grid 14 to a ground plane 36 on the bottom of or within the laminate 12 so that the metallic layer grid 14 and the shield 32 are electrically grounded. The shield 32, vias 34, and ground plane 36 form a shielding structure, which substantially encompasses the component area 16A or 16B of each sub-module 22.

After the electrolytic plating process of step 110, the meta-module 24 is singulated to form modules 10 having two or more sub-modules 22 (step 112). As used herein, the term "singulation" is defined to be the process wherein the individual modules 10 are separated one from the other such that each module 10 is a single module. Finally, the mask, which is positioned on the underside of the strip of laminate 12, may be removed from an input/output (I/O) side 38 of the module 10 (step 114). It should be appreciated that some steps may be rearranged in the present process. For example, the mask may be removed prior to singulation. Likewise, if a layer 26, 28 or 30 is too thick, the layer may be ground down to a desired thickness. The end result of this embodiment is the module 10 as illustrated in FIG. 10.

Figure 12:
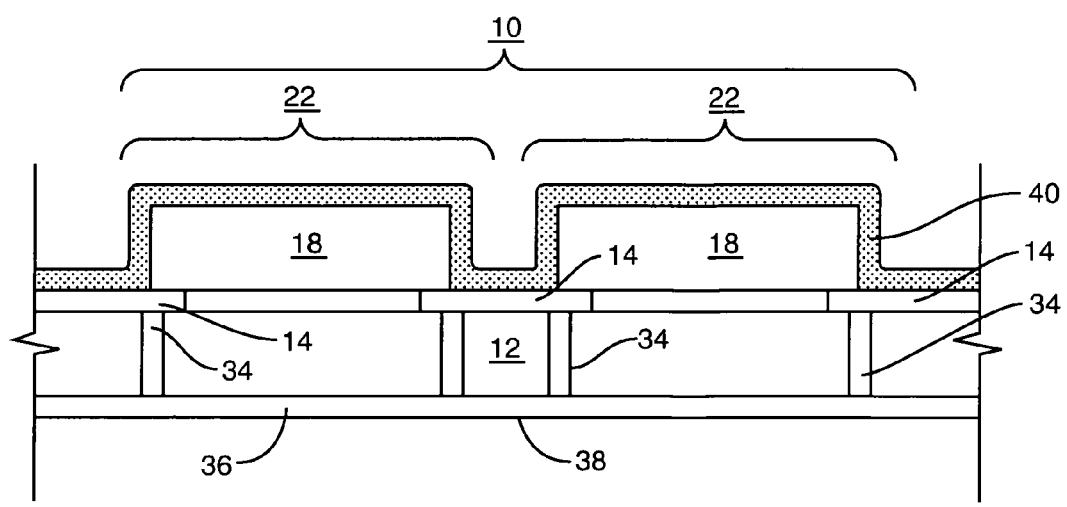
FIG. 12 illustrates an exemplary module constructed according to the embodiment of FIG. 11.
Figure 11:
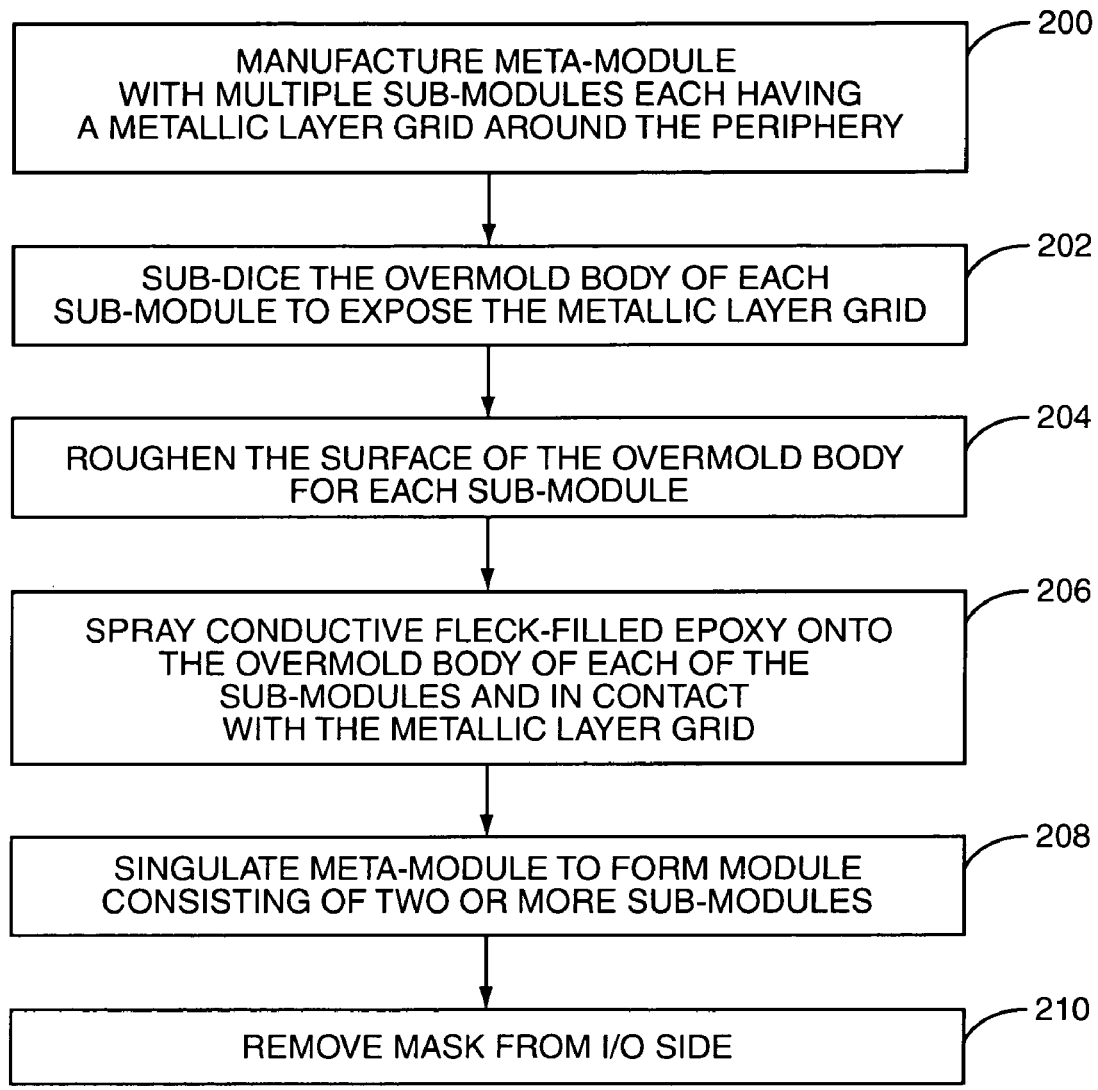
FIG. 11 illustrates a flow diagram of the corresponding steps associated with the manufacturing process according to a second embodiment of the present invention.

FIG. 11 illustrates a process flow diagram detailing the steps for creating the module 10 illustrated in FIG. 12. The second embodiment starts in a manner similar to the first embodiment, wherein the meta-module 24 is manufactured, with each sub-module 22 within the meta-module 24 having its own metallic layer grid 14 around the periphery of the respective sub-module 22 (step 200). Next, a sub-dicing process is employed to cut through the overmold body 18 about each sub-module 22 and to the metallic layer grid 14 (step 202). At this point, a portion of the metallic layer grid 14 is exposed about the periphery of the overmold body 18 for each sub-module 22 (see also FIG. 8). After sub-dicing, the exposed surface of the overmold body 18 of each sub-module 22 is roughened through an abrasion process, a desmear technique, or other process (Step 204). It should be appreciated that a mask (not shown) is positioned on the underside of the laminate 12 so that the shielding process described in the steps below does not interfere with the electrical contacts of each sub-module 22.

After roughening, a conductive fleck-filled epoxy 40 is sprayed over the overmold body 18 of each of the sub-modules 22 and in contact with the metallic layer grid 14 (step 206). In an exemplary embodiment, the conductive fleck-filled epoxy 40 is CHO-SHIELD 610 sold by Chomerics of 77 Dragon Court, Woburn, Mass. 01801. The conductive flecks 42 of the conductive fleck-filled epoxy 40 may be Cu, Ag, a mixture of Cu and Ag, a tin/zinc (Sn/Zn) alloy, or other conductive material as needed or desired. At least one metallic coated or filled via 34 may electrically couple the metallic layer grid 14 to a ground plane 36 on the bottom of or within the laminate 12 so that the metallic layer grid 14 and the conductive fleck-filled epoxy 40 are electrically grounded. The conductive fleck-filled epoxy 40, vias 34, and ground plane 36 form a shielding structure, which substantially encompasses the component area 16A or 16B of each sub-module 22.

After application of the conductive fleck-filled epoxy 40, the meta-module 24 is singulated to form modules 10 having two or more sub-modules 22 (step 208). Again it should be appreciated that the mask may be removed from an input/output side 38 of the module 10 (step 210). This mask may be removed before singulation if needed or desired. Likewise, while CHO-SHIELD 610 has an epoxy 40 to carry the conductive flecks 42, other materials such as polyurethane, acrylic, urethane, or the like could be the vector in which the conductive flecks 42 are carried.

Those skilled in the art will recognize improvements and modifications to the preferred embodiments of the present invention. All such improvements and modifications are considered within the scope of the concepts disclosed herein and the claims that follow.

What is claimed is:
1. A method of manufacturing a sub-module comprising:
  forming a meta-module having a plurality of sub-modules;
  sub-dicing an overmold body of the meta-module to
    expose a metallic layer grid that provides a metal trace about a periphery of an active area of each of the plurality of sub-modules;

applying an electromagnetic shield to the overmold body of each of the plurality of sub-modules and in contact with the metallic layer grid by:
  depositing a seed layer of conductive material on top of the overmold body of each sub-module and in contact with the metallic layer grid;
  generating a second layer on top of the seed layer through an electrolytic plating process; and
  generating a third layer of material on top of the second layer through a second electrolytic plating process; and
singulating the meta-module to form a plurality of modules, each of which having a plurality of individually shielded sub-modules.

2. The method of claim 1 further comprising roughening an exposed surface of the overmold body of each sub-module prior to applying the electromagnetic shield.

3. The method of claim 2 wherein the roughening technique is de-smearing.

4. The method of claim 1 wherein the seed layer of conductive material is Copper (Cu).

5. The method of claim 1 wherein depositing the seed layer comprises using an electroless plating process.

6. The method of claim 1 wherein the second layer is a conductive material.

7. The method of claim 6 wherein the second layer is formed from Copper (Cu).

8. The method of claim 1 wherein the third layer is formed from a material that is a relatively poor conductor compared to the seed layer.

9. The method of claim 8 wherein the third layer is formed from Nickel (Ni).

10. The method of claim 1 further comprising removing a mask from an input/output side of each of the sub-modules after applying the electromagnetic shield.

11. The method of claim 1 wherein each of the plurality of individually shielded sub-modules includes at least one electronic component.

12. The method of claim 1 wherein:
  the seed layer is formed from copper (Cu);
  the second layer is formed from copper (Cu); and
  the third layer is formed from nickel (Ni).

13. The method of claim 12 wherein the seed layer is deposited using an electroless plating process.

14. A method of manufacturing a module comprising:
  providing an electronic meta-module comprising a substrate, circuitry on a surface of the substrate and associated with a plurality of sub-modules, and a body formed from a dielectric material that covers the circuitry associated with the plurality of sub-modules, wherein each group of at least two sub-modules of the plurality of sub-modules is associated with a corresponding module, and at least one sub-module of each group is associated with a metallic element that is covered by the body;
  exposing through the body at least a portion of the metallic element associated with the at least one sub-module of each group to provide a plurality of exposed metallic elements;
  applying an electromagnetic shield material over at least portions of an exterior surface of the body for the at least one sub-module of each group and on the exposed metallic elements by:
    depositing a seed layer of conductive material on top of the body of each sub-module and in contact with the exposed metallic elements;
    generating a second layer on top of the seed layer through an electrolytic plating process; and
    generating a third layer of material on top of the second layer through a second electrolytic plating process; and
  separating each group in the meta-module from each other to provide a plurality of individual modules, each of which having at least two sub-modules.

15. The method of claim 14 wherein the electromagnetic shield material is applied over the at least portions of the exterior surface of the body prior to each group being separated from the electronic meta-module.

16. The method of claim 14 wherein the at least one sub-module in each group has an electromagnetic shield, which is electrically coupled to a corresponding one of the exposed metallic elements.

17. The method of claim 14 wherein each of the at least two sub-modules in each group has an electromagnetic shield, which is electrically coupled to a corresponding one of the exposed metallic elements.

18. The method of claim 14 wherein the body is formed by uniformly covering the circuitry associated with the plurality of sub-modules with the dielectric material, such that the body is initially a single, continuous element that covers all of the plurality of sub-modules prior to exposing the exposed metallic elements.

19. The method of claim 14 wherein the metallic element associated with the at least one sub-module for each group is part of a metallic grid that is formed on the substrate and defines the at least one sub-module for each group.

20. The method of claim 14 wherein the seed layer of conductive material is Copper (Cu).

21. The method of claim 14 wherein the seed layer is deposited using an electroless plating process.

22. The method of claim 14 wherein each of the plurality of individually shielded sub-modules includes at least one electronic component.

23. The method of claim 14 wherein:
  the seed layer is formed from copper (Cu);
  the second layer is formed from copper (Cu); and
  the third layer is formed from nickel (Ni).

24. The method of claim 23 wherein the seed layer is deposited using an electroless plating process.

25. The method of claim 14 further comprising roughening an exposed surface of the body of each sub-module prior to applying the electromagnetic shield material.

26. The method of claim 25 wherein the roughening is de-smearing.

27. The method of claim 25 wherein the seed layer is deposited using an electroless plating process.

28. An electronic module formed by a process comprising:
  providing an electronic meta-module comprising a substrate, circuitry on a surface of the substrate and associated with a plurality of sub-modules, and a body formed from a dielectric material that covers the circuitry associated with the plurality of sub-modules, wherein each group of at least two sub-modules of the plurality of sub-modules is associated with a corresponding module and at least one sub-module of each group is associated with a metallic element that is covered by the body;
  exposing through the body at least a portion of the metallic element associated with the at least one sub-module of each group to provide a plurality of exposed metallic elements;
  applying an electromagnetic shield material over at least portions of an exterior surface of the body for the at least one sub-module of each group and on the exposed metallic elements by:

depositing a seed layer of conductive material on top of the body of each sub-module and in contact with the exposed metallic elements;

generating a second layer on top of the seed layer through an electrolytic plating process; and generating a third layer of material on top of the second layer through a second electrolytic plating process; and separating a group in the meta-module from other groups to provide the electronic module, which has at least two sub-modules.

29. The method of claim 20 wherein the second layer is formed from Copper (Cu).

30. The method of claim 29 wherein the third layer is formed from Nickel (Ni).

31. The electronic module of claim 28 wherein each of the plurality of individually shielded sub-modules includes at least one electronic component.

32. The electronic module of claim 28 wherein:
the seed layer is formed from copper (Cu);
the second layer is formed from copper (Cu); and
the third layer is formed from nickel (Ni).

33. The electronic module of claim 32 wherein the seed layer is deposited using an electroless plating process.

* * * * *